(12) United States Patent
Hosaka (10) Patent No.: US 7,663,386 B2
(45) Date of Patent: Feb. 16, 2010

(54) PROBE CARD

(75) Inventor: Hisatomi Hosaka, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 211 days.

(21) Appl. No.: 10/586,651

(22) PCT Filed: Jan. 20, 2005

(86) PCT No.: PCT/JP2005/000657

§ 371 (c)(1),
(2), (4) Date: Jul. 14, 2008

(87) PCT Pub. No.: WO2005/069019

PCT Pub. Date: Jul. 28, 2005

(65) Prior Publication Data

US 2008/0258745 A1    Oct. 23, 2008

(30) Foreign Application Priority Data

Jan. 20, 2004    (JP) ............................. 2004-012077

(51) Int. Cl.
*G01R 31/02* (2006.01)
*G01R 31/26* (2006.01)
(52) U.S. Cl. .................. 324/754; 324/757; 324/761
(58) Field of Classification Search .......... 324/754–765
See application file for complete search history.

(56) References Cited

U.S. PATENT DOCUMENTS

| | | | | |
|---|---|---|---|---|
| 5,974,662 | A * | 11/1999 | Eldridge et al. | 29/842 |
| 6,791,347 | B2 * | 9/2004 | Ishizaka et al. | 324/761 |
| 7,075,319 | B2 * | 7/2006 | Mori | 324/754 |
| 2004/0257098 | A1 * | 12/2004 | Satou et al. | 324/754 |
| 2008/0048698 | A1 * | 2/2008 | Amemiya et al. | 324/758 |
| 2008/0150558 | A1 * | 6/2008 | Amemiya et al. | 324/754 |

FOREIGN PATENT DOCUMENTS

| | | |
|---|---|---|
| CN | 1328644 A | 12/2001 |
| EP | 1 391 738 A2 | 2/2004 |
| JP | 405218149 * | 8/1993 |
| JP | 2000-67953 | 3/2000 |

(Continued)

OTHER PUBLICATIONS

English language translation of the International Preliminary Examination report for PCT/JP2005/000657 mailed on Oct. 26, 2006.

(Continued)

*Primary Examiner*—Ha Tran T Nguyen
*Assistant Examiner*—Emily Y Chan
(74) *Attorney, Agent, or Firm*—Finnegan, Henderson, Farabow, Garrett & Dunner LLP (57) ABSTRACT

It is an object of the present invention to realize sure electrical connection between a contactor and an object to be inspected without influenced by heat, a reduction in the pre-heating time, and an enhanced throughput.

A probe card of the present invention includes a contactor, a printed wiring board, an interposer provided between the contactor and the printed wiring board to have the both in elastic and electrical contact with each other, a coupling member integrating these, and a reinforcing member reinforcing the printed wiring board integrated via the coupling member.

8 Claims, 8 Drawing Sheets

FOREIGN PATENT DOCUMENTS

| | | |
|---|---|---|
| JP | 2002-134570 | 5/2002 |
| JP | 2003-506686 | 2/2003 |
| JP | 2003-324132 | 11/2003 |
| JP | 2004-14845 | 1/2004 |
| JP | 2004-77153 | 3/2004 |
| WO | WO 00/33096 | 6/2000 |
| WO | WO 01/09623 A1 | 2/2001 |

OTHER PUBLICATIONS

First Office Action dated Feb. 1, 2008, issued in corresponding Chinese Application No. 200580002852.3.

* cited by examiner

PROBE CARD

TECHNICAL FIELD

The present invention relates to a probe card used in inspecting an electrical characteristic of an object to be inspected such as a wafer, and more particularly, to a probe card capable of high-reliability inspection even with thermal deformation.

BACKGROUND ART

Figure 7:
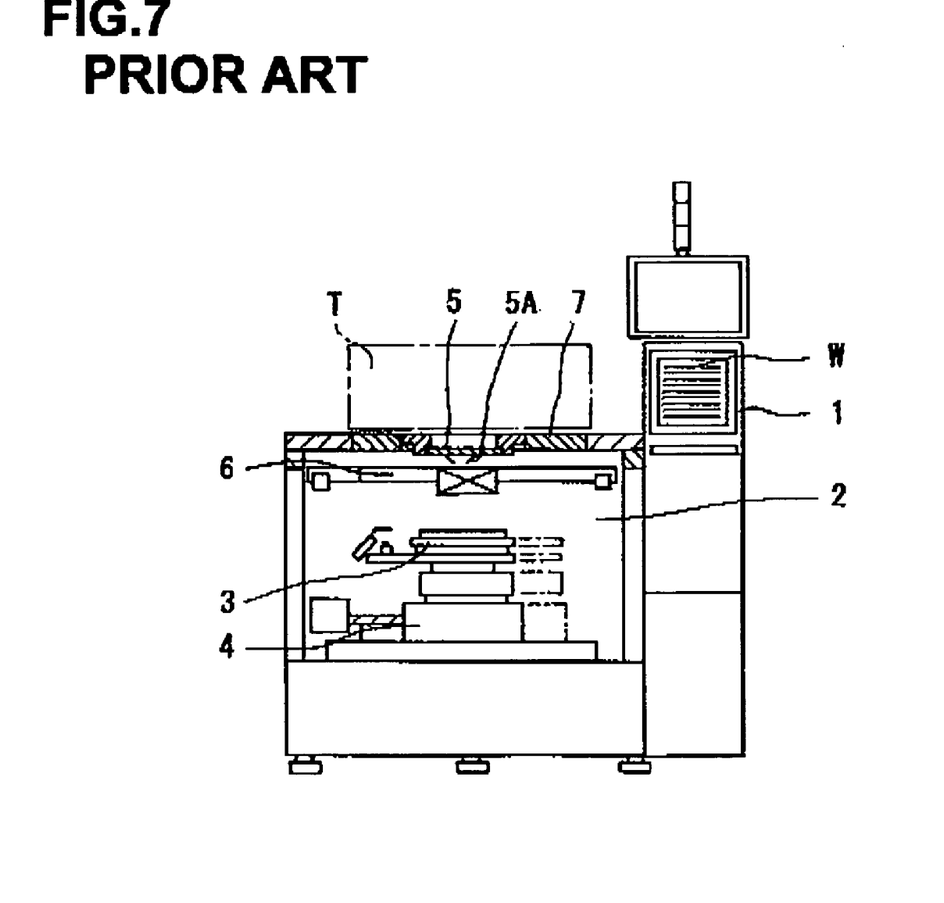
FIG. 7 A front view, partly in cutaway, showing an example of a probe device.

A probe card, when in use, is mounted on a probe device shown in, for example, FIG. 7. As shown in this drawing, the probe device includes a loader chamber 1 carrying a wafer W and a prober chamber 2 where an electrical characteristic of the wafer carried from the loader chamber 1 is inspected, and the probe device inspects an electrical characteristic of the wafer W in the prober chamber 2 after pre-aligning the wafer W in the course of the carriage of the wafer W in the loader chamber 1.

Figure 8A:
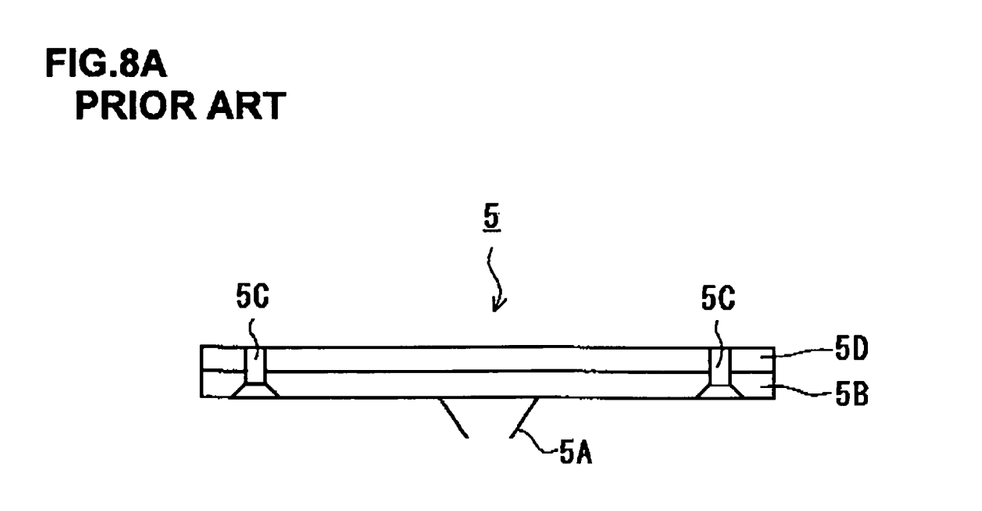

As shown in FIG. 7, the prober chamber 2 includes: a mounting table (main chuck) 3 on which the pre-aligned wafer W is placed and whose temperature is adjustable; an XY table 4 for moving the main chuck 3 in X and Y directions; a probe card 5 disposed above the main chuck 3 which moves via the XY table 4; and a positioning mechanism (alignment mechanism) 6 for accurately aligning a plurality of probes 5A of the probe card 5 with a plurality of electrode pads of the wafer W on the main chuck 3. The probe card 5 has the plural probes 5A, a printed wiring board 5B to which these probes 5A are connected, and a reinforcing member 5D made of metal such as stainless steel, coupled to the printed wiring board 5B via a coupling member 5C, and reinforcing the printed wiring board 5B, as shown in, for example, FIG. 8(a). The main chuck 3 has a lifting mechanism therein to lift up/down the wafer W to electrically connect or disconnect the wafer W to/from the probes 5A.

Further, as shown in FIG. 7, a test head T of a tester is turnably disposed on a head plate 7 of the probe chamber 2, and the test head T and the probe card 5 are electrically connected to each other via a performance board (not shown). The wafer W on the main chuck 3 is set to a temperature within a temperature range of, for example, −20° C. to +150° C., the tester sends an inspection signal to the probes 5A via the test head T and the performance board, and the inspection signal is applied to the electrode pads of the wafer W from the probes 5A, whereby electrical characteristics of a plurality of semiconductor elements (devices) formed on the wafer W are inspected. In a case where high-temperature inspection is to be conducted, the wafer W is heated to a predetermined temperature (100° C. or higher) via a temperature adjustment mechanism (heating mechanism) provided in the main chuck 3, and then the wafer inspection is conducted.

Since an object to be inspected generates heat during the inspection, the printed wiring board 5B of the probe card 5 thermally expands to thermally deform due to the influence of the heat. Further, since the main chuck 3 is heated when the high-temperature inspection is to be conducted, this heat together with the heat generated during the inspection causes thermal deformation of the printed wiring board 5B. Therefore, the reinforcing member 5D has conventionally been used to reinforce the printed wiring board B, thereby reducing and preventing the thermal deformation of the probe card 5. A patent document 1 proposes an art to assign probes to semiconductor elements, which can align tips of probe elements without changing the position of a probe card.

[Patent document 1] Japanese Patent Application Laid-open No. 2000-67953

DISCLOSURE OF THE INVENTION

Problems to Be Solved by the Invention

Figure 8B:
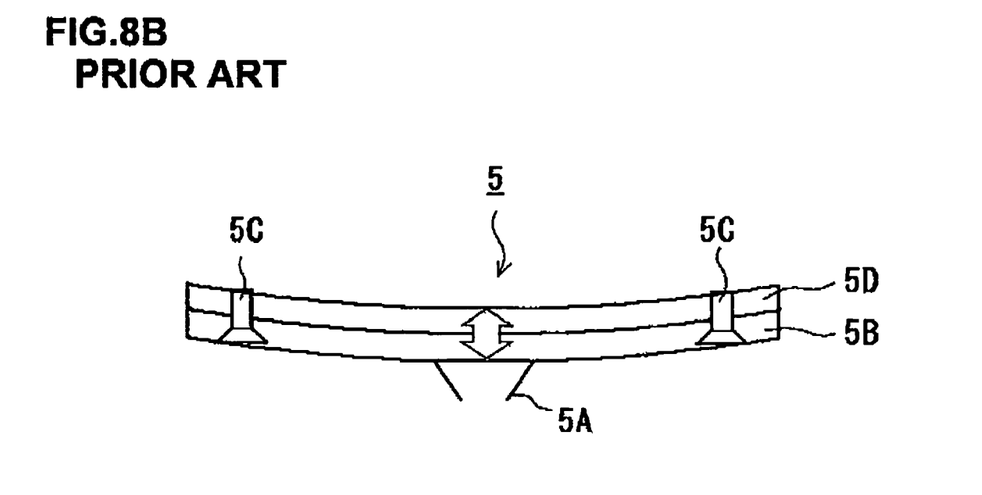

However, in the conventional probe card, the metal reinforcing member 5D prevents the thermal deformation of the printed wiring board 5B, but the reinforcing member 5D cannot completely inhibit a stress caused by the thermal deformation, so that the probe card 5 warps downward to curve due to the thermal deformation as shown in an exaggerated manner in FIG. 8(b), which has posed a problem that the probes 5A are misaligned to cause variation among contact positions with an object to be inspected, leading to poor connection between the probes 5A and the object to be inspected. Moreover, the probe card 5 is pre-heated so as to be thermally stabilized before the inspection, but it takes a lot of time to thermally stabilize the probe card 5, which has posed a problem that throughput decreases.

The present invention was made to solve the aforesaid problems and an object thereof is to provide a probe card realizing sure electrical connection of a contactor and an object to be inspected without influenced by heat and a reduction in the time for pre-heating, leading to enhanced throughput.

Means for Solving the Problems

In order to achieve the object stated above, the present invention is a probe card that inspects an electrical characteristic of an object to be inspected, including: a contactor; a circuit board; an intermediate member provided between the contactor and the circuit board to have the contactor and the circuit board in elastic and electrical contact with each other; a coupling member integrating the contactor, the circuit board, and the intermediate member; and a reinforcing member reinforcing the circuit board integrated via the coupling member.

The intermediate member may be an interposer having a substrate and a plurality of elastically deformable contacts provided at least on the circuit board side of the substrate.

In the probe card, a plurality of elastically deformable contacts may be provided as the intermediate member on the contactor.

The intermediate member may be made of conductive rubber.

In the probe card, elastic members may be interposed between the contactor and the circuit board and between the circuit board and the reinforcing member respectively.

In the probe card, the contactor may have a ceramic substrate and a plurality of probes provided on a surface of the ceramic substrate on a side to be in contact with the object to be inspected.

The reinforcing member may have a flat plate shape and be disposed opposite the intermediate member across the circuit board, the reinforcing member and the contactor may be fixed to each other via the coupling member, and the circuit board may be movably attached to the coupling member.

Further, the reinforcing member may have a pressing member pressing the circuit board toward the contactor side.

The reinforcing member may have a plurality of the pressing members.

EFFECT OF THE INVENTION

According to the present invention, it is possible to provide a probe card realizing sure electrical connection between the contactor and an object to be inspected without influenced by heat and a reduction in the pre-heating time, leading to an enhanced throughput.

BRIEF DESCRIPTION OF THE DRAWINGS

FIG. 1 Views schematically showing an embodiment of a probe card of the present invention, (a) being a cross-sectional view thereof and (b) being an enlarged cross-sectional view of an interposer.

FIG. 8 Views showing a conventional probe card, (a) being a side view showing a state when it is at room temperature and (b) being a side view showing a state when it is thermally deformed.

EXPLANATION OF CODES 10 probe card
11 contactor
11A ceramic substrate
11B probe
11E contact
12 printed wiring board (circuit board)
13 coupling member
14 reinforcing member
15 interposer
15B, 15C contact

BEST MODE FOR CARRYING OUT THE INVENTION

Figure 2:
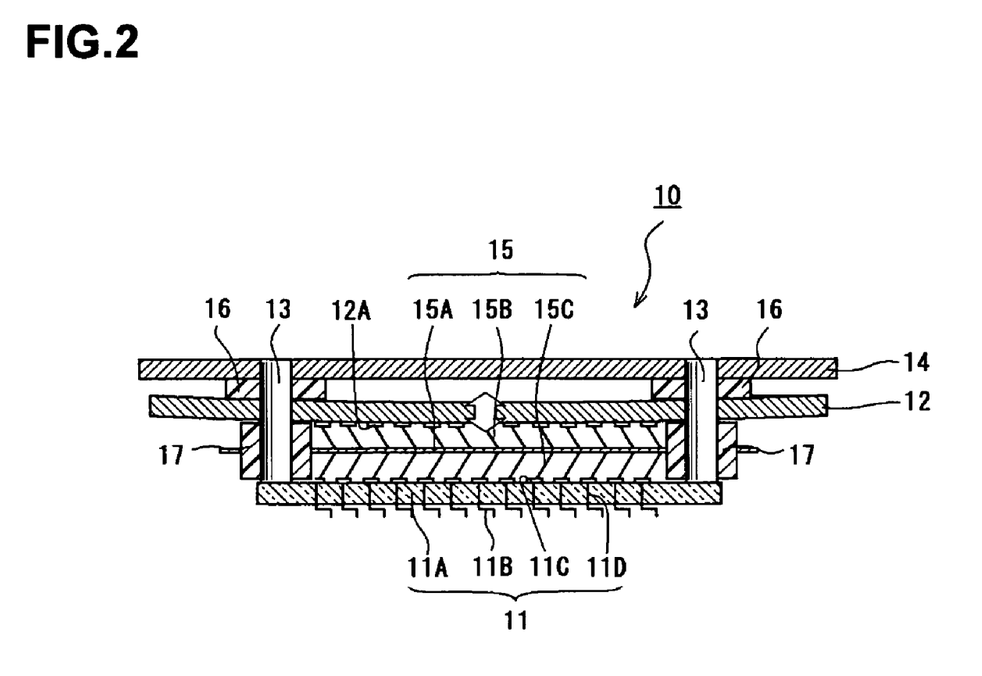
FIG. 2 A cross-sectional view corresponding to FIG. 1(a), showing a state of thermal deformation of the probe card shown in FIG. 1.
Figure 3:
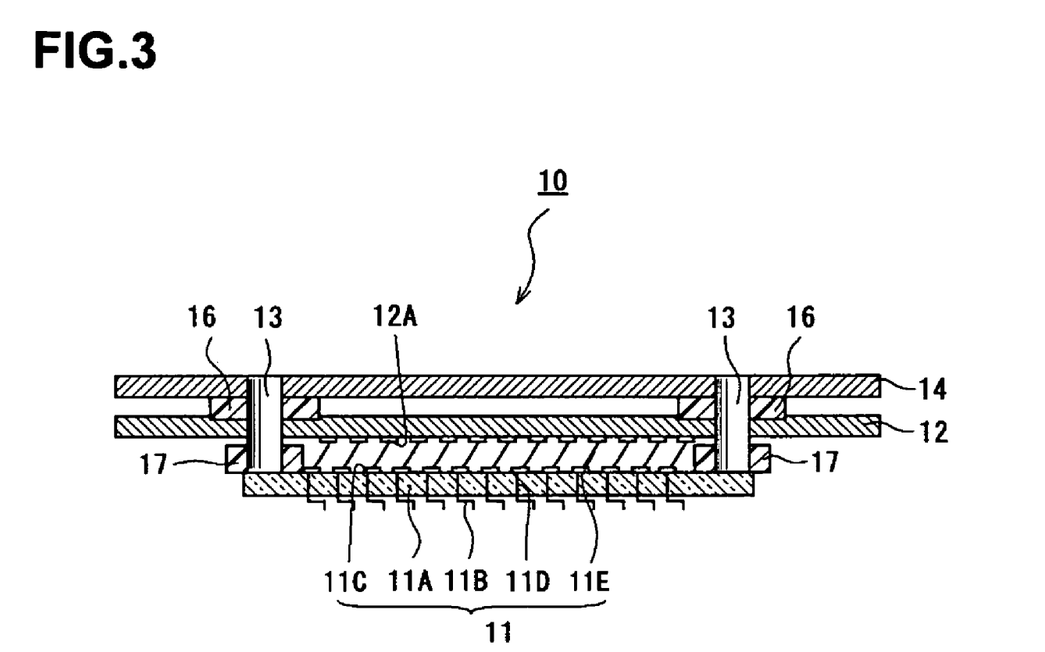
FIG. 3 A cross-sectional view corresponding to FIG. 1(a), showing still another embodiment of the probe card of the present invention.

Hereinafter, the present invention will be described based on examples shown in FIG. 1 to FIG. 6. In the examples, the same reference numerals and symbols are used to designate the same portions or corresponding portions, and features thereof will be described. FIG. 1 are views schematically showing one embodiment of a probe card of the present invention, (a) being a cross-sectional view thereof and (b) being an enlarged cross-sectional view of an interposer, FIG. 2 is a cross-sectional view corresponding to FIG. 1(a), showing anther embodiment of the probe card of the present invention, and FIG. 3 is a cross-sectional view corresponding to FIG. 1(a), showing still another embodiment of the probe card of the present invention.

Example 1

Figure 1A:
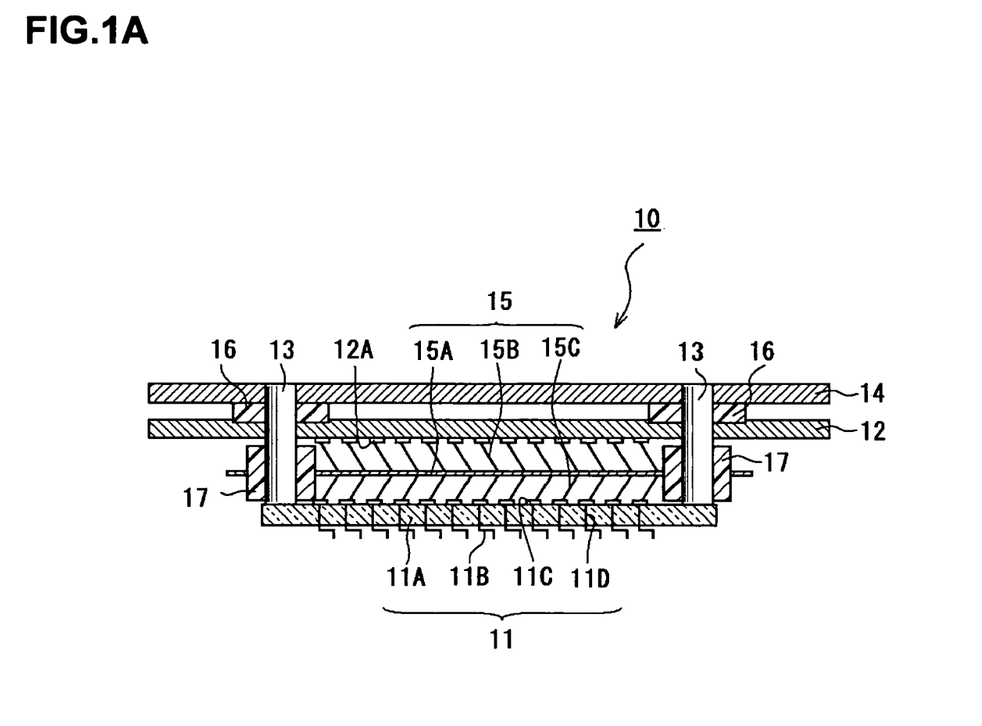
Figure 1B:
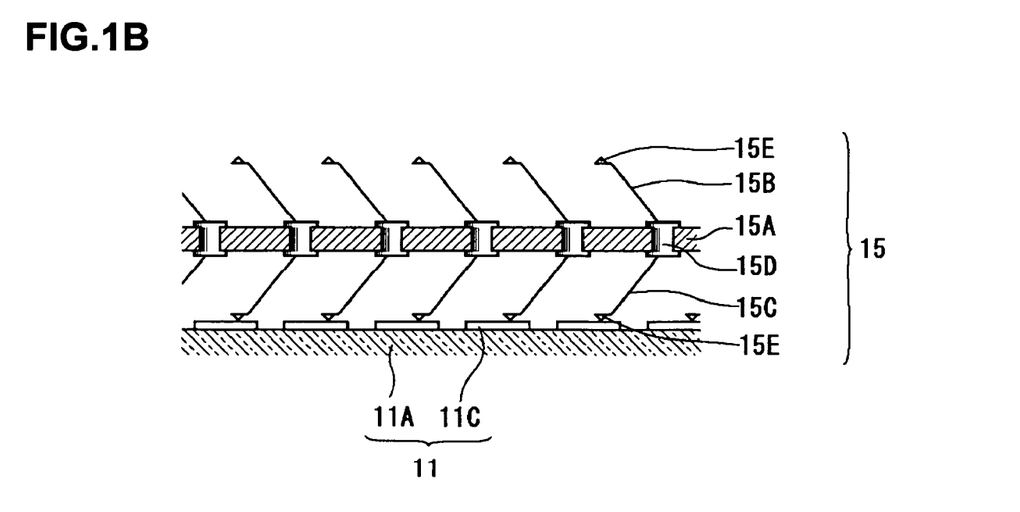

A probe card 10 of this example includes, as shown in, for example, FIG. 1, a contactor 11, a printed wiring board 12 electrically connected to the contactor 11, a coupling member 13 coupling and integrating the both 11, 12, and a reinforcing member 14 reinforcing the printed wiring board 12 integrated by the coupling member 13, and the probe card 10 is used in inspecting an electrical characteristic of an object to be inspected such as a wafer.

As shown in FIGS. 1(a), (b), the contactor 11 has a ceramic substrate 11A made of, for example, ceramic, a plurality of probes 11B disposed on a lower surface of the ceramic substrate 11A in correspondence to a plurality of electrode pads (not shown) of the object to be inspected, terminal electrodes 11C formed on an upper surface of the ceramic substrate 11A in correspondence to these probes 11B, and connection wirings 11D formed in the ceramic substrate 11A to connect these terminal electrodes and the probes 11B, so that a plurality of chips can be inspected at the same time.

The contactor 11 is formed by using microfabrication technology such as, for example, micromachine technology. The plural terminal electrodes 11C of the ceramic substrate 11A are electrically connected to a plurality of terminal electrodes of the printed wiring board 12 respectively via a later-described interposer.

The reinforcing member 14 is made of a low-expansion alloy such as, for example, Invar which is small in coefficient of linear expansion, so as to expand as little as possible even when receiving heat during the inspection. A coefficient of linear expansion of Invar is about 2 to 4 ppm/° C., which is far smaller compared with that of the printed wiring board 12 made of resin. Though a plane sectional shape of the reinforcing member 14 is not shown, the reinforcing member 14 is composed of, for example, a ring formed along an outer peripheral edge of the printed wiring board 12, a disk formed in a center portion of the printed wiring board 12, and a coupling part coupling the ring and the disk. Incidentally, as the printed wiring board 12, a conventionally known printed wiring board made of resin is usable.

Between the contactor 11 and the printed wiring board 12, an interposer 15 having the both 11, 12 in elastic and electrical contact with each other is provided as an intermediate member, and owing to this interposer 15, later-described thermal deformation of the printed wiring board 12 is absorbed and the pre-heating time of the probe card 10 is reduced.

As shown in FIGS. 1(a), (b), the interposer 15 has a substrate 15A made of, for example, ceramic, a plurality of elastically deformable contacts 15B provided on an upper surface of the substrate 15A in correspondence to the terminal electrodes 12A of the printed wiring board 12, a plurality of elastically deformable contacts 15C provided on a lower surface of the substrate 15A in correspondence to the terminal electrodes 11C of the ceramic substrate 11A, and via hole conductors 15D electrically connecting the contacts 15B, 15C provided on the upper and lower surfaces, and the interposer 15 is fixed to the coupling member 13 via a later-described elastic member.

The plural contacts 15B on the upper surface of the substrate 15A extend diagonally upward from the respective via hole conductors 15D to come into electrical contact with the terminal electrodes 12A of the printed wiring board 12 via terminals 15E provided at tips thereof. Further, the plural contacts 15C on the lower surface of the substrate 15A extend diagonally downward from the respective via hole conductors 15D to come into electrical contact with the terminal electrodes 11C on the upper surface of the ceramic substrate 11A via terminals 15E at tips thereof. These contacts 15B, 15C are both made of elastic metal, for example, tungsten or the like to be elastically deformable, and have functions of absorbing thermal deformation of the printed wiring board 12 as well as electrically connecting the contactor 11 and the printed wiring board 12.

The upper and lower contacts 15B, 15C are both structured to be surely in contact with the corresponding terminal electrodes 12A, 11C respectively while the probe card 10 is in a thermally stable state (a state during the inspection). In other words, the terminal electrodes 12A of the printed wiring board 12 and the terminal electrodes 11C of the contactor 11 are formed large enough to be surely in contact with the terminals 15E of the contacts 15B, 15C of the interposer when the printed wiring board 12 thermally deforms to the maximum.

Further, elastic members 16, 17 made of rubber or the like are put on the upper and lower sides of the printed wiring board 12, and these elastic members 16, 17 are interposed between the contactor 11 and the printed wiring board 12 and between the printed wiring board 12 and the reinforcing member 14 respectively. These elastic members 16, 17 absorb thermal deformation of the printed wiring board 12 while being put on the reinforcing member 14, thereby stabilizing the contact position of the probes 11B.

Next, the operation of the probe card 10 will be described with reference to FIG. 2. In a case where high-temperature inspection of an object to be inspected is conducted by using the probe card 10 of this example, pre-heating is performed prior to the inspection so as to thermally stabilize a main chuck. At this time, the main chuck (not shown) is heated by an internal temperature adjustment mechanism of the main chuck and the main chuck is brought closer to the probe card 10 to pre-heat the probe card 10 while or after the temperature of the main chuck is raised up to a predetermined temperature. When the temperature of the probe card 10 has risen by the pre-heating, the printed circuit board 12 larger in coefficient of linear expansion than other members in the probe card 10 thermally deforms to expand more than the other members. At this time, a thermal stress of the printed wiring board 12 can escape nowhere since the periphery of the printed wiring board 12 is constricted by the coupling member 13 so that the printed wiring board 12 gradually warps downward to curve as shown in FIG. 2 as it expands. Meanwhile, the contactor 11 and the reinforcing member 14 are far smaller in coefficient of linear expansion than the printed wiring board 12 and thus thermally deform only to a small extent, so that they maintain their flatness.

In this example, even when only the printed wiring board 12 in the probe card 10 curves downward as described above, the upper contacts 15C of the interposer 15 absorb the curving of the printed wiring board 12, and the elastic members 16, 17 absorb the thermal deformation of the printed wiring board 12 in the periphery of the coupling member 13, so that the thermal stress given to the contactor 11 side from the printed wiring board 12 is made ineffective, whereby the flatness of the contactor 11 is maintained. Moreover, even when the printed wiring board 12 thermally deforms to press down the upper contacts 15B of the interposer 15, the contacts 15B are positioned within the terminal electrodes 12A of the printed wiring board 12 and thus do not lose their function as the interposer 15, so that the electrical contact between the contactor 11 and the printed wiring board 12 can be maintained.

As has been described hitherto, according to this example, the contactor 11, the printed wiring board 12, the interposer 15 provided between the contactor 11 and the printed wiring board 12 to have the both in elastic and electrical contact with each other, the coupling member 13 integrating these, and the reinforcing member 14 reinforcing the printed wiring board 12 integrated via the coupling member are provided, so that even when the printed wiring board 12 curves downward due to thermal deformation to give a stress to the contactor 11 side, the elasticity of the interposer 15 can make this stress ineffective and thus can prevent the positional deviation of the probes 11B of the contactor 11 from the electrode pads of an object to be inspected. Moreover, even when the temperature of the probe card 10 rises up to an inspection temperature after the pre-heating to gradually cause the thermal deformation of the printed wiring board 12, since the contactor 11 and the printed wiring board 12 surely come in electrical contact with each other via the interposer 15, the pre-heating do not have to be continued until the printed wiring board 12 is thermally stabilized, so that the pre-heating time can be made far shorter compared with the conventional pre-heating time, leading to an enhanced throughput.

Further, according to this example, since the interposer 15 has the elastically deforming contacts 15B, 15C on the upper and lower surfaces of the substrate 15A, these contacts 15B, 15C can absorb the thermal deformation of the printed wiring board 12.

Example 2

A probe card 10 of this example has the same structure as that of the above-described example except in that, as shown in, for example, FIG. 3, a plurality of elastically deformable contacts 11E are provided on an upper surface of the contactor 11, in place of the interposer 15 shown in FIG. 1 and FIG. 2.

The contacts 11E are formed similarly to the contacts 15C of the interposer 15 shown in FIG. 1(b), and are directly connected to terminal electrodes 11C formed on an upper surface of a ceramic substrate 11A of the contactor 11. Consequently, the contactor 11 is in electrical contact with terminal electrodes 12A of a printed wiring board 12 via the plural contacts 11E.

According to this example, even if the printed wiring board 12 deforms due to thermal expansion, the thermal deformation can be absorbed by the contacts 11E of the contactor 11, so that the same operation and effect as those of the example 1 can be expected. Further, according to this example, the structure of the probe card 10 can be more simplified than that of the example 1.

Figure 4:
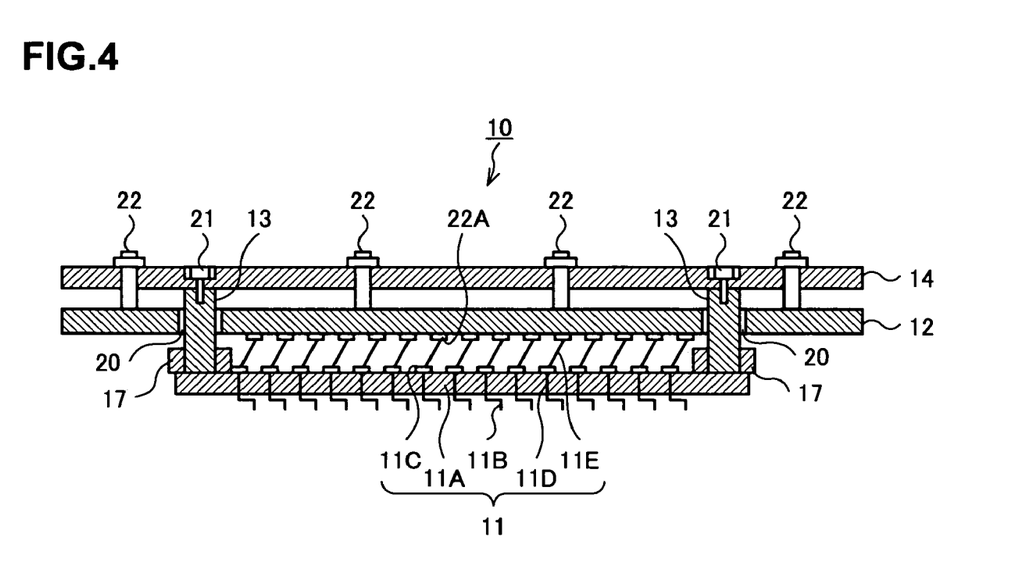
FIG. 4 A vertical cross-sectional view showing another example of the probe card.
Figure 5:
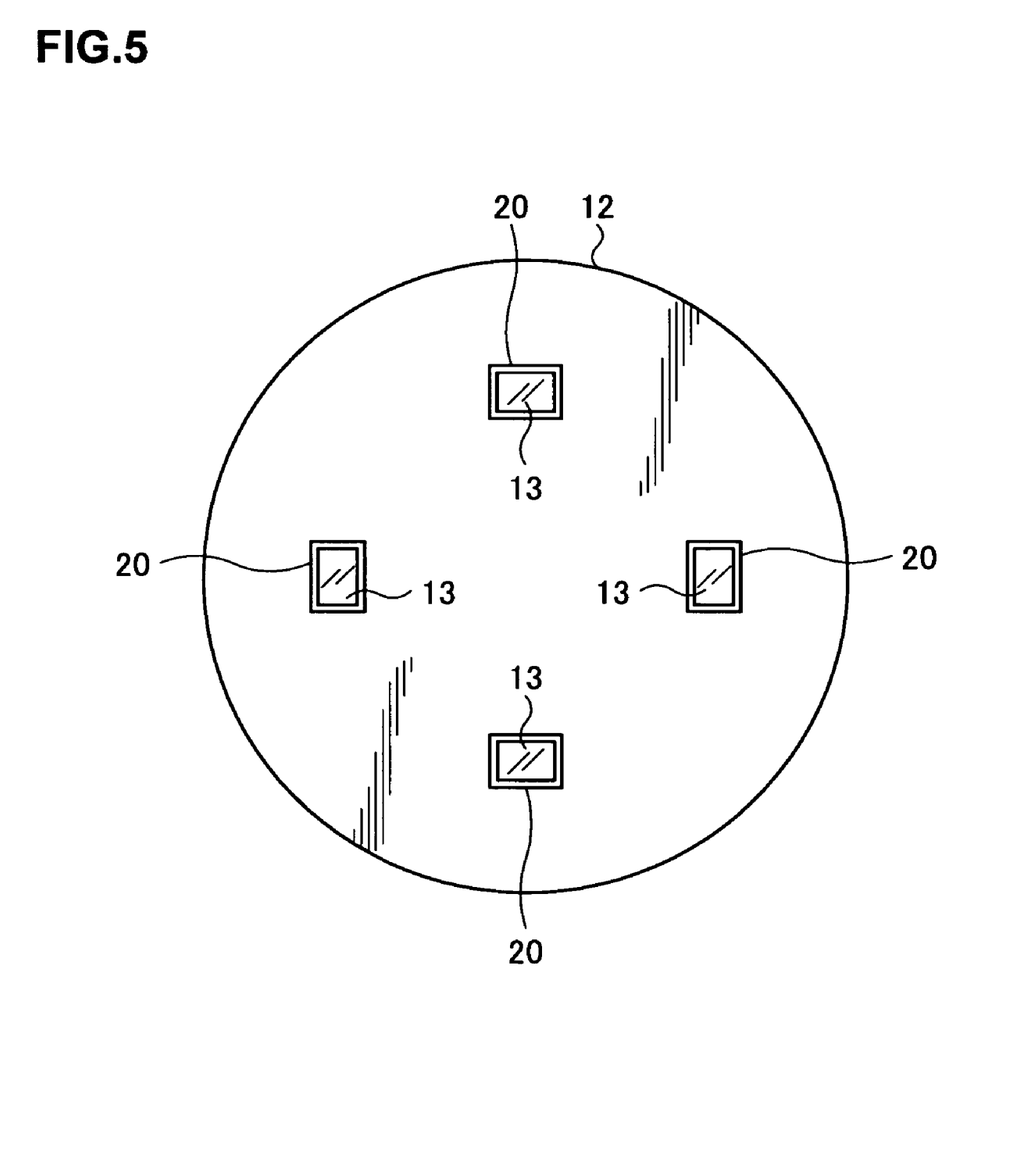
FIG. 5 A plane view of a printed wiring board of the probe card in FIG. 4.

In the example 2 described above where the contacts 11E are provided on the upper surface of the contactor 11, a possible structure is such that, as shown in FIG. 4, a reinforcing member 14 is formed in a disk shape that is the same shape as that of the printed wiring board 12 and is disposed on an upper surface side of the printed wiring board 12, and the reinforcing member 14 and the contactor 11 are coupled to each other via a coupling member 13, and the printed wiring board 12 is movably attached to the coupling member 13. In this case, for example, the coupling member 13 is formed in a substantially quadratic prism shape that is long in an up/down direction and stands on a plurality of places, for example, four places of an outer periphery of the contactor 11. Each of the coupling members 13 is fixed to the contactor 11 at its lower end side. In the printed wiring board 12, through holes 20 through which the respective coupling members 13 pass are formed as shown in FIG. 4 and FIG. 5. The through holes 20 are formed slightly larger than the coupling members 13 so that there leave gaps in the through holes 20 while the coupling members 13 pass therethrough. This allows the printed wiring board 12 to move relative to the coupling members 13.

Figure 6:
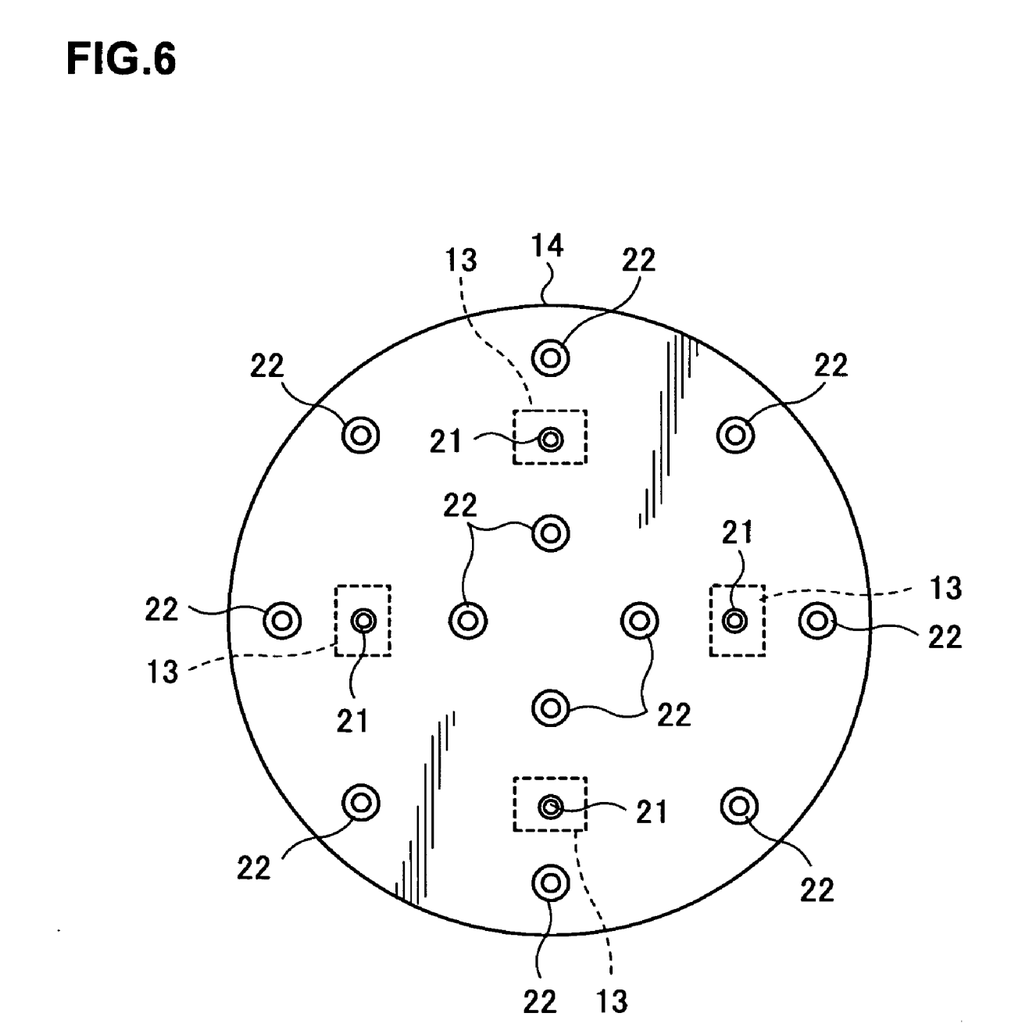
FIG. 6 A plane view of a reinforcing member of the probe card in FIG. 4.

A reinforcing member 14 is fixed to upper end portions of the coupling members 13 with bolts 21 being fixing members, as shown in, for example, FIG. 4. At this time, for example, a gap is formed between the reinforcing member 14 and the printed wiring board 12. Further, the reinforcing member 14 is fixed to the coupling members 13 so as to be parallel to the contact 11. In the reinforcing member 14, provided are pressing members 22 passing through the reinforcing member 14 in a thickness direction from an upper surface side toward a lower surface side and capable of pressing the printed wiring board 12 from above. The pressing members 22 are provided in a plurality of places in the surface of the reinforcing member 14 as shown in, for example, FIG. 6. The pressing members 22 are provided at equal intervals on the same circumference on an inner peripheral portion side of the coupling members 13 and on the same circumference on an outer peripheral portion side of the coupling members 13 when seen from above. Each of the pressing members 22 is constituted of, for example, a bolt that moves up/down by being rotated. The pressing members 22 are capable of pressing the printed wiring board 12 toward the contactor 11 side by pressing the upper surface of the printed wiring board 12.

According to this example, since the printed wiring board 12 is not completely fixed to the coupling members 13 but moves in the gap, so that thermal deformation of the printed wiring board 12 is absorbed by the gap. As a result, even if the printed wiring board 12 thermally deforms, flatness of the contactor 11 is maintained and the positional deviation of probes 11B of the contactor 11 from electrode pads of an object to be inspected is prevented. Further, since the pressing members 22 can press the printed wiring board 12 toward the contactor 11 side, it is possible to stabilize electrical contact between the printed wiring board 12 and the contacts 11E of the contactor 11. Further, since the plural pressing members 22 can press the plurality places in the surface of the printed wiring board 12, it is possible to keep the printed wiring board 12 horizontal to further stabilize electrical contact between the printed wiring board 12 and each of the contacts 11E.

It should be noted that in the example described above, an interposer 15 instead of the contacts 11E may be interposed between the printed wiring board 12 and the contactor 11 as in the example 1.

The above-described examples are in no way to limit the present invention and it is to be understood that any probe card is embraced in the present invention, providing that the probe card has, between the circuit board and a contactor which constitute a probe card, an interposer capable of absorbing thermal deformation of the circuit board. For example, in a case where conductive rubber is used as the interposer, the same operation and effect as those of the above-described embodiments can be also expected. Further, the shape and material of the contacts are not limited to specific ones so far as the contacts are elastically deformable and having a conductive property.

INDUSTRIAL APPLICABILITY

The present invention can be suitably utilized as a probe card of, for example, an inspection device.

What is claimed is:

1. A probe card that inspects an electrical characteristic of an object to be inspected, comprising: a contactor, a circuit board; an intermediate member provided between said contactor and said circuit board to have said contactor and said circuit board in elastic and electrical contact with each other; a coupling member integrating said contactor, said circuit board, and said intermediate member; and a reinforcing member reinforcing said circuit board integrated via said coupling member,
    wherein elastic members are interposed between said contactor and said circuit board and between said circuit board and said reinforcing member respectively.

2. The probe card according to claim 1,
    wherein said intermediate member is an interposer having a substrate and a plurality of elastically deformable contacts provided at least on said circuit board side of the substrate.

3. The probe card according to claim 1,
    wherein a plurality of elastically deformable contacts are provided as said intermediate member on said contactor.

4. The probe card according to claim 1,
    wherein said intermediate member is made of conductive rubber.

5. The probe card according to claim 1,
    wherein said contactor has a ceramic substrate and a plurality of probes provided on a surface of the ceramic substrate on a side to be in contact with the object to be inspected.

6. The probe card according to claim 1,
    wherein said reinforcing member has a flat plate shape and is disposed opposite said intermediate member across said circuit board;
    wherein said reinforcing member and said contactor are fixed to each other via said coupling member; and
    wherein said circuit board is movably attached to said coupling member.

7. The probe card according to claim 6,
    wherein said reinforcing member has a pressing member pressing said circuit board toward said contactor side.

8. The probe card according to claim 7,
    wherein said reinforcing member has a plurality of the pressing members.

* * * * *